United States Patent
Hong et al.

(10) Patent No.: US 12,020,775 B2
(45) Date of Patent: Jun. 25, 2024

(54) SEMICONDUCTOR DEVICE FOR CALCULATING AND CALIBRATING DELAY AMOUNT

(71) Applicant: SK hynix Inc., Icheon-si (KR)

(72) Inventors: Gi Moon Hong, Icheon-si (KR); Dae Han Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 175 days.

(21) Appl. No.: 17/858,519

(22) Filed: Jul. 6, 2022

(65) Prior Publication Data

US 2023/0282256 A1    Sep. 7, 2023

(30) Foreign Application Priority Data

Mar. 4, 2022 (KR) .................. 10-2022-0028389

(51) Int. Cl.
*G11C 7/22* (2006.01)
*H03K 5/133* (2014.01)
*G11C 29/02* (2006.01)
*G11C 29/28* (2006.01)

(52) U.S. Cl.
CPC ............. *G11C 7/222* (2013.01); *H03K 5/133* (2013.01); *G11C 29/023* (2013.01); *G11C 29/28* (2013.01); *G11C 2207/2254* (2013.01)

(58) Field of Classification Search
CPC .......... G11C 2207/2254; G11C 29/023; G11C 29/028; G11C 7/222; H03K 5/133

USPC .................................................. 365/190, 193
See application file for complete search history.

(56) References Cited

U.S. PATENT DOCUMENTS

| | | | |
|---|---|---|---|
| 7,518,423 B2 | 4/2009 | Kumata | |
| 8,477,543 B2 * | 7/2013 | Kwon | G11C 7/1078 |
| | | | 365/198 |
| 9,508,401 B2 * | 11/2016 | Song | G11C 7/1045 |
| 2022/0075564 A1 * | 3/2022 | Moon | G11C 7/222 |
| 2022/0398043 A1 * | 12/2022 | Yasuda | G11C 16/10 |

FOREIGN PATENT DOCUMENTS

KR    1020140019941 A    2/2014

* cited by examiner

*Primary Examiner* — Ly D Pham
(74) *Attorney, Agent, or Firm* — WILLIAM PARK & ASSOCIATES LTD.

(57) ABSTRACT

A semiconductor device includes a strobe transmission circuit configured to output an oscillation strobe signal, through a first delay path circuit, as a strobe signal when a first measurement operation is performed and configured to output the oscillation strobe signal through a second delay path circuit as the strobe signal when a second measurement operation is performed, and a calibration circuit configured to compare the number of times the strobe signal toggles during the first measurement operation to the number of times the strobe signal toggles during the second measurement operation to calibrate the delay amounts of the first and second delay path circuits to be the same.

20 Claims, 6 Drawing Sheets

SEMICONDUCTOR DEVICE FOR CALCULATING AND CALIBRATING DELAY AMOUNT

CROSS-REFERENCE TO RELATED APPLICATIONS

The present application claims priority under 35 U.S.C. 119(a) to Korean Patent Application No. 10-2022-0028389, filed on Mar. 4, 2022, which is incorporated herein by reference in its entirety.

BACKGROUND

1. Technical Field

Embodiments of the present disclosure relate to semiconductor devices for calculating and calibrating a delay amount.

2. Related Art

A semiconductor device may perform various internal operations by transmitting signals to internal circuits through delay paths. The delay amount of the delay path may vary depending on PVT (process, voltage, temperature) changes, and the like.

SUMMARY

According to an embodiment of the present disclosure, there may be provided a semiconductor device including a strobe transmission circuit configured to output an oscillation strobe signal, through a first delay path circuit, as a strobe signal when a first measurement operation is performed and configured to output the oscillation strobe signal through a second delay path circuit as the strobe signal when a second measurement operation is performed, and a calibration circuit configured to compare the number of times the strobe signal toggles during the first measurement operation to the number of times the strobe signal toggles during the second measurement operation to calibrate the delay amounts of the first and second delay path circuits to be the same.

In addition, according to another embodiment of the present disclosure, there may be provided an electronic device including a strobe transmission circuit configured to output one of a pre-strobe signal and an oscillation strobe signal as a strobe signal through a delay path circuit based on whether a measurement operation is performed, an oscillation strobe signal generation circuit configured to receive the strobe signal to output the strobe signal as the oscillation strobe signal while the measurement operation is being performed, and a counter configured to count the number of toggles of the oscillation strobe signal to generate a count signal while the measurement operation is being performed.

DETAILED DESCRIPTION OF THE EMBODIMENTS

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
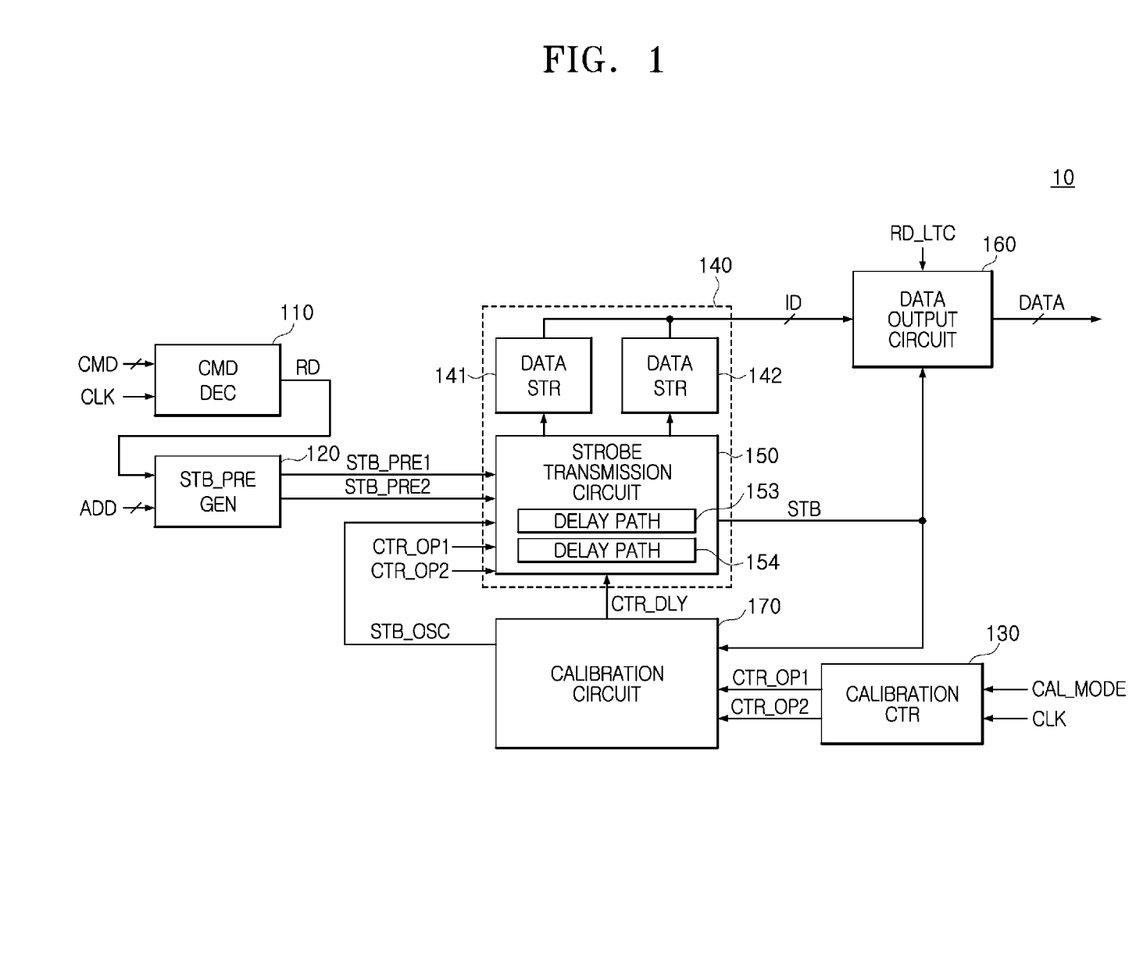
FIG. 1 is a block diagram illustrating a configuration of a semiconductor device according to an embodiment of the present disclosure.

FIG. 1 is a block diagram illustrating a configuration of a semiconductor device 10 according to an embodiment of the present disclosure. As shown in FIG. 1, the semiconductor device 10 may include a command decoder (CMD DEC) 110, a pre-strobe signal generation circuit (STB_PRE GEN) 120, a calibration control circuit (CALIBRATION CTR) 130, a core circuit 140, a data output circuit (DATA OUTPUT CIRCUIT) 160, and a calibration circuit (CALIBRATION CIRCUIT) 170. The semiconductor device 10 may be implemented with a memory device storing and outputting data (DATA).

The semiconductor device 10 may receive a command (CMD), an address (ADD), and a clock (CLK) from an external device (not shown) to perform various internal operations including a read operation and a calibration mode. The calibration mode may be set as a mode in which the delay amount of delay path circuits that are included in the semiconductor device 10 is calibrated to be the same.

The command decoder 110 may generate a read signal RD for performing a read operation based on the command CMD in synchronization with the clock CLK. The command decoder 110 may decode the command CMD having a logic level combination for a read operation to activate the read signal RD.

The pre-strobe signal generation circuit 120 may generate one of a first pre-strobe signal STB_PRE1 and a second pre-strobe signal STB_PRE2 based on the address ADD and the read signal RD. The address ADD may have a combination that corresponds to data storage regions 141 and 142 storing internal data ID. More specifically, when the combination of the address ADD corresponds to the first data storage region 141 in the read operation, the pre-strobe signal generation circuit 120 may generate the first pre-strobe signal STB_PRE1 for outputting the internal data ID that is stored in the first data storage region 141. Conversely, when the combination of the address ADD corresponds to the second data storage region 142 in the read operation, the pre-strobe signal generation circuit 120 may generate the second pre-strobe signal STB_PRE2 for outputting the internal data ID that is stored in the second data storage region 142.

The calibration control circuit 130 may generate a first operation control signal CTR_OP1 and a second operation control signal CTR_OP2 based on a calibration mode signal CAL_MODE in synchronization with the clock CLK. The calibration mode signal CAL_MODE may be activated to perform the calibration mode. The calibration mode may accompany a first measurement operation and a second measurement operation that are sequentially performed. The first measurement operation may be set as an operation of calculating a delay amount of a first delay path circuit 153 by measuring the number of times a strobe signal STB that is output through the first delay path circuit 153 is toggled. The second measurement operation may be set as an operation of calculating a delay amount of a second delay path circuit 154 by measuring the number of times a strobe signal STB that is output through the second delay path circuit 154 is toggled. The first operation control signal CTR_OP1 may be activated while the first measurement operation is being performed in the calibration mode, and the second operation control signal CTR_OP2 may be activated while the second measurement operation is being performed in the calibration mode. The calibration control circuit 130 may sequentially activate the first operation control signal CTR_OP1 and the second operation control signal CTR_OP2 in synchronization with the clock CLK when performing the calibration mode based on the calibration mode signal CAL_MODE. That is, the calibration control circuit 130 may control the second measurement operation to be performed after the first measurement operation is performed in the calibration mode. The number of periods in which the first operation control signal CTR_OP1 is activated and the number of periods in which the second operation control signal CTR_OP2 is activated may be set to be the same. For example, both the periods in which the first operation control signal CTR_OP1 is activated and the periods in which the second operation control signal CTR_OP2 is activated may be set as K periods of the clock CLK. K may be set to a natural number.

The core circuit 140 may include the first data storage region (DATA STR) 141, the second data storage region (DATA STR) 142, and a strobe transmission circuit (STROBE TRANSMISSION CIRCUIT) 150. Each of the first data storage region 141 and the second data storage region 142 may include a memory bank that stores and outputs the internal data ID. The strobe transmission circuit 150 may include the first delay path circuit (DELAY PATH) 153 and the second delay path circuit (DELAY PATH) 154. Each of the first delay path circuit 153 and the second delay path circuit 154 may include an inverter chain in which a plurality of inverters are connected in series.

The strobe transmission circuit 150 may receive the first pre-strobe signal STB_PRE1, the second pre-strobe signal STB_PRE2, and an oscillation strobe signal STB_OSC to output the strobe signal STB based on the first operation control signal CTR_OP1, the second operation control signal CTR_OP2, and a delay control signal CTR_DLY. The delay control signal CTR_DLY may be generated for calibrating the delay amount of each of the first delay path circuit 153 and the second delay path circuit 154. The strobe transmission circuit 150 may transmit the first pre-strobe signal STB_PRE1 to the first data storage region 141 through the first delay path circuit 153 to control the internal data ID that is stored in the first data storage region 141 to be output. The strobe transmission circuit 150 may transmit the second pre-strobe signal STB_PRE2 to the second data storage region 142 through the second delay path circuit 154 to control the internal data ID that is stored in the second data storage region 142 to be output. The oscillation strobe signal STB_OSC may be toggled while the first measurement operation or the second measurement operation is being performed in the calibration mode.

Depending on whether the first measurement operation is performed, the strobe transmission circuit 150 may output one of the first pre-strobe signal STB_PRE1 and the oscillation strobe signal STB_OSC as a strobe signal STB through the first delay path circuit 153 based on the first operation control signal CTR_OP1. More specifically, when the first operation control signal CTR_OP1 for performing the first measurement operation is deactivated in the calibration mode, the strobe transmission circuit 150 may output the first pre-strobe signal STB_PRE1 as the strobe signal STB through the first delay path circuit 153. Conversely, when the first operation control signal CTR_OP1 is activated in the calibration mode, the strobe transmission circuit 150 may output the oscillation strobe signal STB_OSC as the strobe signal STB through the first delay path circuit 153 while the first measurement operation is being performed.

Depending on whether the second measurement operation is performed, the strobe transmission circuit 150 may output one of the second pre-strobe signal STB_PRE2 and the oscillation strobe signal STB_OSC as the strobe signal STB through the second delay path circuit 154 based on the second operation control signal CTR_OP2. More specifically, when the second operation control signal CTR_OP2 for performing the second measurement operation is deactivated in the calibration mode, the strobe transmission circuit 150 may output the second pre-strobe signal STB_PRE2 as the strobe signal STB through the second delay path circuit 154. Conversely, when the second operation control signal CTR_OP2 is activated in the calibration mode, the strobe transmission circuit 150 may output the oscillation strobe signal STB_OSC as the strobe signal STB through the second delay path circuit 154 while the second measurement operation is being performed.

The configuration and operation method of the core circuit 140 will be described later with reference to FIG. 2.

The data output circuit 160 may latch the internal data ID in synchronization with the strobe signal STB and may output the latched internal data ID as data DATA in synchronization with a read latency signal RD_LTC. The read latency signal RD_LTC may be generated by delaying the read signal RD by a latency time when a read operation is performed.

The calibration circuit 170 may receive the strobe signal STB to generate the oscillation strobe signal STB_OSC while the first measurement operation or the second measurement operation is being performed in the calibration mode based on the first operation control signal CTR_OP1 and the second operation control signal CTR_OP2. The calibration circuit 170 may generate the oscillation strobe signal STB_OSC toggles while the first measurement operation or the second measurement operation is being performed in the calibration mode. For example, in a case in which the number of inverters that are included in each of the first delay path circuit 153 and the second delay path circuit 154 is set to an even number, the calibration circuit 170 may invert the strobe signal STB having a logic "low" level to generate the oscillation strobe signal STB_OSC having a logic "high" level. The calibration circuit 170 may again receive the strobe signal STB, having the logic "high" level through an even number of inverters. The calibration circuit 170 may control the toggling of the oscillation strobe signal STB_OSC by inverting the re-inputted strobe signal STB having a logic "high" level and outputting the oscillation strobe signal STB_OSC having a logic "low" level. As another example, in a case in which the number of inverters that are included in each of the first delay path circuit 153 and the second delay path circuit 154 is set to an odd number, the calibration circuit 170 may buffer the strobe signal STB having a logic "low" level to generate the oscillation strobe signal STB_OSC having a logic "low" level. The calibration circuit 170 may again receive the strobe signal STB, having a logic "high" level through an odd number of inverters. The calibration circuit 170 may control the toggling of the oscillation strobe signal STB_OSC by buffering the strobe signal STB having a logic "high" level and outputting the oscillation strobe signal STB_OSC having a logic "high" level.

The calibration circuit 170 may calculate the delay amount of the first delay path circuit 153 by measuring the number of times the strobe signal STB is toggled during the first measurement operation based on the first operation control signal CTR_OP1. In the first measurement operation, as the delay amount of the first delay path circuit 153 increases, the measured number of toggles of the strobe signal STB may decrease. The calibration circuit 170 may calculate the delay amount of the second delay path circuit 154 by measuring the number of times the strobe signal STB is toggled during the second measurement operation based on the second operation control signal CTR_OP2. In the second measurement operation, as the delay amount of the second delay path circuit 154 increases, the measured number of toggles of the strobe signal STB may decrease. Accordingly, the calibration circuit 170 may control the strobe signal STB that is output from the delay path circuits 153 and 154 that are connected in a loop form to toggle when the calibration mode is performed and may measure the number of times the strobe signal STB is toggled, thereby calculating the delay amounts of the delay path circuits 153 and 154.

The calibration circuit 170 may compare the number of toggles of the strobe signal STB that is measured in the first measurement operation to the number of toggles of the strobe signal STB that is measured in the second measurement operation to generate the delay control signal CTR_DLY. The calibration circuit 170 may calibrate the delay amounts of the first delay path circuit 153 and the second delay path circuit 154 to be the same based on the delay control signal CTR_DLY.

When the number of toggles of the strobe signal STB that are measured in the first measurement operation and the number of toggles of the strobe signal STB that are measured in the second measurement operation are different, the calibration circuit 170 may adjust the delay amount of at least one of the first delay path circuit 153 and the second delay path circuit 154. More specifically, when the number of toggles of the strobe signal STB that are measured in the first measurement operation is greater than the number of toggles of the strobe signal STB that are measured in the second measurement operation, the calibration circuit 170 may increase the delay amount of the first delay path circuit 153 or decrease the delay amount of the second delay path circuit 154. Conversely, when the number of toggles of the strobe signal STB that are measured in the first measurement operation is less than the number of toggles of the strobe signal STB that are measured in the second measurement operation, the calibration circuit 170 may decrease the delay amount of the first delay path circuit 153 or increase the delay amount of the second delay path circuit 154. The calibration circuit 170 may calibrate the delay amounts of the first delay path circuit 153 and the second delay path circuit 154 in proportion to the difference between the number of toggles of the strobe signal STB that are measured in the first measurement operation and the number of toggles of the strobe signal STB that are measured in the second measurement operation. For example, the calibration circuit 170 may calibrate the delay amounts of the first delay path circuit 153 and the second delay path circuit 154 to be larger as the difference between the number of toggles of the strobe signal STB that are measured in the first measurement operation and the number of toggles of the strobe signal STB that are measured in the second measurement operation increases. When the number of toggles of the strobe signal STB that are measured in the first measurement operation is the same as the number of toggles of the strobe signal STB that are measured in the second measurement operation, the calibration circuit 170 may maintain the delay amounts of the first delay path circuit 153 and the second delay path circuit 154. Accordingly, the calibration circuit 170 may constantly set the timing of the strobe signal STB that is output through the first delay path circuit 153 and the second delay path circuit 154 when a read operation is performed.

The configuration and operation method of the calibration circuit 170 will be described later with reference to FIG. 3.

Figure 2:
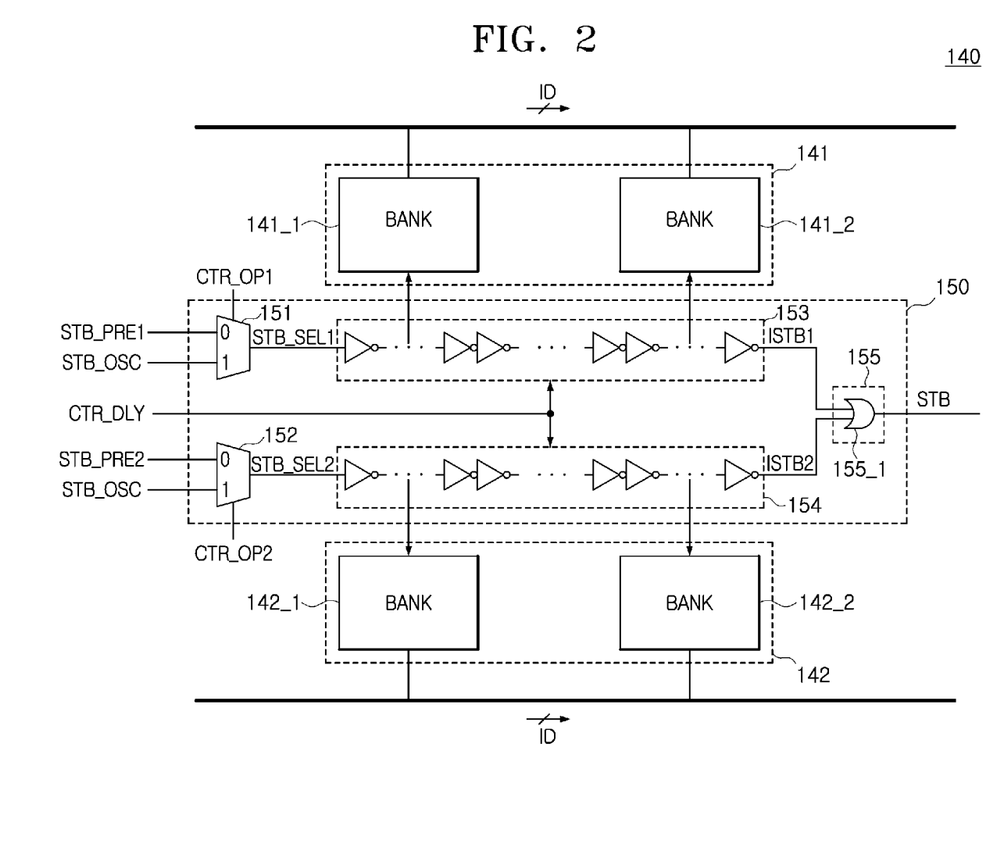
FIG. 2 is a diagram according to an embodiment of a core circuit shown in FIG. 1.

FIG. 2 is a block diagram according to an embodiment of the core circuit 140 shown in FIG. 1. As shown in FIG. 2, the core circuit 140 may include the first data storage region 141, the second data storage region 142, and the strobe transmission circuit 150.

The first data storage region 141 may include memory banks 141_1 and 141_2 that store and output internal data ID. The second data storage region 142 may include memory banks 142_1 and 142_2 that store and outputting the internal data ID.

The strobe transmission circuit 150 may include a first selector 151, a second selector 152, the first delay path circuit 153, the second delay path circuit 154, and a strobe signal synthesis circuit 155.

The first selector 151 may select one of a first pre-strobe signal STB_PRE1 and an oscillation strobe signal STB_OSC to output the selected signal as a first selection strobe signal STB_SEL1 based on the first operation control signal CTR_OP1 depending on whether the first measurement operation is performed. More specifically, the first selector 151 may output the first pre-strobe signal STB_PRE1 as the first selection strobe signal STB_SEL1 when the first operation control signal CTR_OP1 is deactivated. The first selector 151 may output the oscillation strobe signal STB_OSC as the first selection strobe signal STB_SEL1 when the first operation control signal CTR_OP1 is activated.

The second selector 152 may select one of a second pre-strobe signal STB_PRE2 and the oscillation strobe signal STB_OSC to output the selected signal as a second selection strobe signal STB_SEL2 based on the second operation control signal CTR_OP1 depending on whether the second measurement operation is performed. More specifically, the second selector 152 may output the second pre-strobe signal STB_PRE2 as the second selection strobe signal STB_SEL2 when the second operation control signal CTR_OP2 is deactivated. The second selector 152 may output the oscillation strobe signal STB_OSC as the second selection strobe signal STB_SEL2 when the second operation control signal CTR_OP1 is activated.

The first delay path circuit 153 may include an inverter chain in which a plurality of inverters are connected in series. The first delay path circuit 153 may delay the first selection strobe signal STB_SEL1 based on a delay control signal CTR_DLY to output the delayed signal as a first internal strobe signal ISTB1. The delay amount of the first delay path circuit 153 may be calibrated by the delay control signal CTR_DLY. The first selection strobe signal STB_SEL1 may be transmitted to the memory banks 141_1 and 141_2 through the first delay path circuit 153.

The second delay path circuit 154 may include an inverter chain in which a plurality of inverters are connected in series. The second delay path circuit 154 may delay the second selection strobe signal STB_SEL2 based on the delay control signal CTR_DLY to output the delayed signal as a second internal strobe signal ISTB2. The delay amount of the second delay path circuit 154 may be calibrated by the delay control signal CTR_DLY. The second selection strobe signal STB_SEL2 may be transmitted to the memory banks 141_1 and 141_2 through the second delay path circuit 154.

The strobe signal synthesis circuit 155 may synthesize the first internal strobe signal ISTB1 and the second internal strobe signal ISTB2 into the strobe signal STB. The strobe signal synthesis circuit 155 may include an OR gate 155_1. The OR gate 155_1 may output the strobe signal STB at a logic "high" level when the first internal strobe signal ISTB1 or the second internal strobe signal ISTB2 is input at a logic "high" level.

Figure 3:
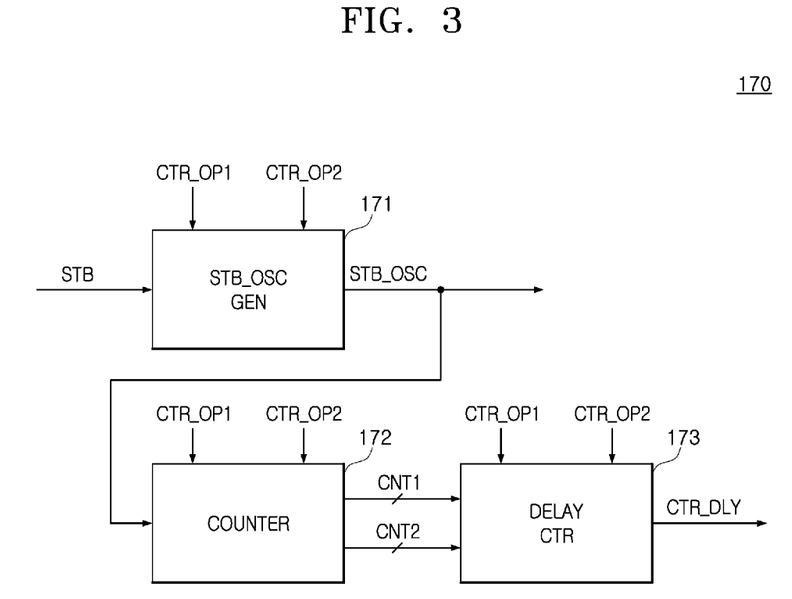
FIG. 3 is a block diagram illustrating a configuration according to an embodiment of a calibration circuit shown in FIG. 1.

FIG. 3 is a block diagram illustrating a configuration according to an embodiment of the calibration circuit 170, shown in FIG. 1. As shown in FIG. 3, the calibration circuit 170 may include an oscillation strobe signal generation circuit (STB_OSC GEN) 171, a counter (COUNTER) 172, and a delay control circuit (DELAY CTR) 173.

The oscillation strobe signal generation circuit 171 may receive the strobe signal STB to generate the oscillation strobe signal STB_OSC in the calibration mode based on the first operation control signal CTR_OP1 and the second operation control signal CTR_OP2. More specifically, the oscillation strobe signal generation circuit 171 may receive the strobe signal STB to output the oscillation strobe signal STB_OSC to the strobe transmission circuit (150 in FIG. 1) and may receive the toggled strobe signal STB, again, from the strobe transmission circuit 150 while the first measurement operation is being performed in the calibration mode based on the first operation control signal CTR_OP1. The oscillation strobe signal generation circuit 171 may receive the strobe signal STB to output the oscillation strobe signal STB_OSC to the strobe transfer circuit 150 and may receive the toggled strobe signal STB, again, from the strobe transmission circuit 150 while the second measurement operation is being performed in the calibration mode based on the second operation control signal CTR_OP2. The configuration and operation method of the oscillation strobe signal generation circuit 171 will be described later with reference to FIG. 4.

The counter 172 may count the number of toggles of the oscillation strobe signal STB_OSC that is received in the calibration mode based on the first operation control signal CTR_OP1 and the second operation control signal CTR_OP2 to generate a first count signal CNT1 and a second count signal CNT2. More specifically, the counter 172 may increase the value of the first count signal CNT1 whenever the number of toggles of the oscillation strobe signal STB_OSC that is received while the first measurement operation is being performed in the calibration mode based on the first operation control signal CTR_OP1. The value of the first count signal CNT1 may be proportional to the number of toggles of the strobe signal STB in the first measurement operation. The counter 172 may count the number of toggles of the oscillation strobe signal STB_OSC that is received while the second measurement operation is being performed in the calibration mode based on the second operation control signal CTR_OP2 and may increase the value of the second count signal CNT2. The value of the second count signal CNT2 may be proportional to the number of toggles of the strobe signal STB in the second measurement operation.

The delay control circuit 173 may compare the value of the first count signal CNT1 and the value of the second count signal CNT2 to generate the delay control signal CTR_DLY based on the first operation control signal CTR_OP1 and the second operation control signal CTR_OP2. The delay control circuit 173 may store the value of the first count signal CNT1 when the first measurement operation is completed in the calibration mode based on the first operation control signal CTR_OP1. The delay control circuit 173 may store the value of the second count signal CNT2 when the second measurement operation is completed in the calibration mode based on the second operation control signal CTR_OP2. The delay control circuit 173 may calibrate the delay amounts of the first delay path circuit (153 of FIG. 1) and the second delay path circuit (154 of FIG. 1) to be the same based on the delay control signal CTR_DLY. More specifically, when the value of the first count signal CNT1 is greater than the value of the second count signal CNT2, the delay control circuit 173 may increase the delay amount of the first delay path circuit 153 or decrease the delay amount of the second delay path circuit 154 based on the delay control signal CTR_DLY. Conversely, when the value of the first count signal CNT1 is smaller than the value of the second count signal CNT2, the delay control circuit 173 may decrease the delay amount of the first delay path circuit 153 or increase the delay amount of the second delay path circuit 154 based on the delay control signal CTR_DLY. The delay control circuit 173 may calibrate the delay amounts of the first delay path circuit 153 and the second delay path circuit 154 in proportion to the difference between the values of the first count signal CNT1 and the second count signal CNT2. When the values of the first count signal CNT1 and the second count signal CNT2 are the same, the delay control circuit 173 may maintain the delay amounts of the first delay path circuit 153 and the second delay path circuit 154.

Figure 4:
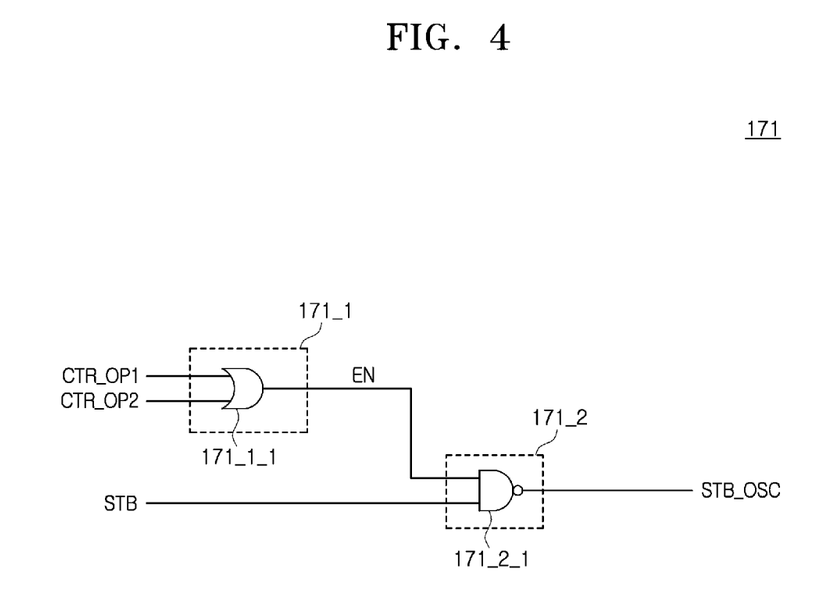
FIG. 4 is a circuit diagram according to an embodiment of an oscillation strobe signal generation circuit shown in FIG. 3.

FIG. 4 is a circuit diagram according to an embodiment of the oscillation strobe signal generation circuit 171 shown in FIG. 3. As shown in FIG. 4, the oscillation strobe signal generation circuit 171 may include a control circuit 171_1 and an inverting circuit 171_2.

The control circuit 171_1 may activate an enable signal EN while the first measurement operation or the second measurement operation is performed in the calibration mode based on the first operation control signal CTR_OP1 and the second operation control signal CTR_OP2. The control circuit 171_1 may include an OR gate 171_1_1. The OR gate 171_1_1 may activate the enable signal EN to a logic "high" level when the first operation control signal CTR_OP1 or the second operation control signal CTR_OP2 is activated to a logic "high" level.

The inverting circuit 171_2 may buffer the strobe signal STB to output a buffered signal of the strobe signal STB as an oscillation strobe signal STB_OSC while the enable signal EN is activated. The inverting circuit 171_2 may include a NAND gate 171_2_1. The NAND gate 171_2_1 may inversely buffer the strobe signal STB to output an inversely buffered strobe signal as the oscillation strobe signal STB_OSC while the enable signal EN is activated to a logic "high" level.

Figure 5:
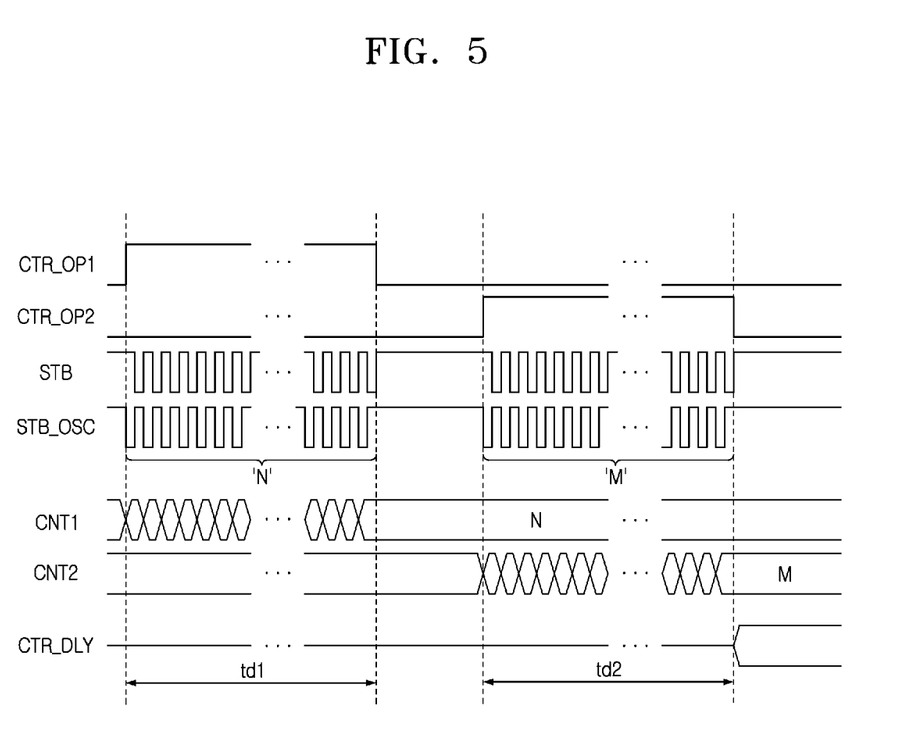
FIG. 5 is a timing diagram illustrating an operation of the calibration circuit shown in FIG. 3.

FIG. 5 is a timing diagram illustrating an operation of the calibration circuit 170 shown in FIG. 3. As shown in FIG. 5, the first operation control signal CTR_OP1 and the second operation control signal CTR_OP2 may be sequentially activated when a calibration mode is performed. The first operation control signal CTR_OP1 may be activated during a period td1 in which the first measurement operation is performed in the calibration mode, and the second operation control signal CTR_OP2 may be activated during a period td2 in which the second measurement operation is performed in the calibration mode. The period td1 and the period td2 may be set to be the same.

The oscillation strobe signal generation circuit 171 may receive the strobe signal STB to generate the oscillation strobe signal STB_OSC during the period td1 based on the first operation control signal CTR_OP1 and may again receive the strobe signal STB, through the first delay path circuit (153 of FIG. 1). The counter 172 may increase the value of the first count signal CNT1 by "1" whenever the oscillation strobe signal STB_OSC is input during the period td1 based on the first operation control signal CTR_OP1. When the oscillation strobe signal STB_OSC is input "N" times to the counter 172 during the period td1, the value of the first count signal CNT1 may be set to "N". The delay control circuit 173 may store the value of the first count signal CNT1 when the first measurement operation is completed based on the first operation control signal CTR_OP1. "N" may be set to a natural number.

The oscillation strobe signal generation circuit 171 may receive the strobe signal STB to generate oscillation strobe signal STB_OSC during the period td2 based on the second operation control signal CTR_OP2 and may again receive the strobe signal STB, through the second delay path circuit (154 of FIG. 1). The counter 172 may increase the value of the second count signal CNT2 by "1" whenever the oscillation strobe signal STB_OSC is input during the period td2 based on the second operation control signal CTR_OP2. When the oscillation strobe signal STB_OSC is input "M" times to the counter 172 during the period td2, the value of the second count signal CNT2 may be set to "M". The delay control circuit 173 may store the value of the second count signal CNT2 when the second measurement operation is completed based on the second operation control signal CTR_OP2. "M" may be set to a natural number.

The delay control circuit 173 may compare the value "N" of the first count signal CNT1 with the value "M" of the second count signal CNT2 to generate the delay control signal CTR_DLY for calibrating the delay amount of the first delay path circuit (153 of FIG. 1) and the second delay path circuit (154 of FIG. 1) to be the same.

Figure 6:
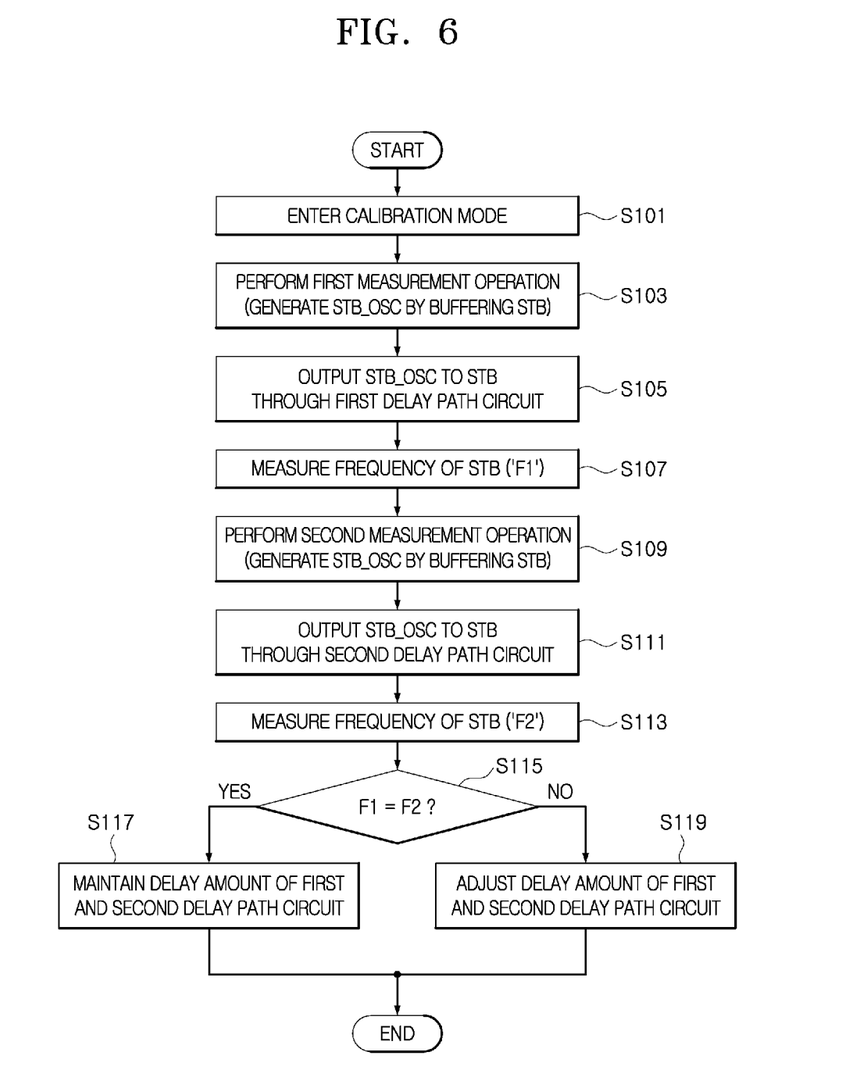
FIG. 6 is a flowchart illustrating a calibration mode performed in the semiconductor device shown in FIG. 1.

FIG. 6 is a flowchart illustrating a calibration mode performed in the semiconductor device 10 shown in FIG. 1.

In a step S101, when the semiconductor device 10 enters the calibration mode, a calibration mode signal CAL_MODE may be activated.

In a step S103, the calibration control circuit 130 may activate a first operation control signal CTR_OP1 for performing a first measurement operation based on the activated calibration mode signal CAL_MODE. The calibration circuit 170 may receive a strobe signal STB to generate an oscillation strobe signal STB_OSC while the first measurement operation is being performed based on the activated first operation control signal CTR_OP1.

In a step S105, the strobe transmission circuit 150 may receive the oscillation strobe signal STB_OSC to generate the strobe signal STB through the first delay path circuit 153 while the first measurement operation is being performed based on the activated first operation control signal CTR_OP1.

In a step S107, the calibration circuit 170 may receive the toggled strobe signal STB, again, and may measure the number of toggles "F1" of the strobe signal STB in the first measurement operation.

In a step S109, the calibration control circuit 130 may deactivate the first operation control signal CTR_OP1 that is activated to perform the first measurement operation and may activate the second operation control signal CTR_OP2 for performing the second measurement operation. The calibration circuit 170 may receive the strobe signal STB to generate the oscillation strobe signal STB_OSC while the second measurement operation is being performed based on the activated second operation control signal CTR_OP2.

In a step S111, the strobe transmission circuit 150 may receive the oscillation strobe signal STB_OSC to generate the strobe signal STB through the second delay path circuit 154 while the second measurement operation is being performed based on the activated second operation control signal CTR_OP2.

In a step S113, the calibration circuit 170 may receive the toggled strobe signal STB, again, and may measure the number of toggles "F2" of the strobe signal STB in the second measurement operation.

In a step S115, the calibration control circuit 130 may deactivate the second operation control signal CTR_OP2 that is activated to perform the second measurement operation. The calibration circuit 170 may compare the number of toggles "F1" of the strobe signal STB that is measured in the first measurement operation with the number of toggles "F2" of the strobe signal STB that is measured in the second measurement operation.

In the step S115, when the number of toggles "F1" of the strobe signal STB that is measured in the first measurement operation is the same as the number of toggles "F2" of the strobe signal STB that is measured in the second measurement operation, the calibration circuit 170 may maintain the delay amounts of the first delay path circuit 153 and the second delay path circuit 154 in a step S117.

In the step S115, when the number of toggles "F1" of the strobe signal STB that is measured in the first measurement operation is different from the number of toggles "F2" of the strobe signal STB that is measured in the second measurement operation, the calibration circuit 170 may calibrate the delay amounts of the first delay path circuit 153 and the second delay path circuit 154 to be the same in a step S119.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
a strobe transmission circuit configured to output an oscillation strobe signal, through a first delay path circuit, as a strobe signal when a first measurement operation is performed and configured to output the oscillation strobe signal through a second delay path circuit as the strobe signal when a second measurement operation is performed; and
a calibration circuit configured to compare the number of times the strobe signal toggles during the first measurement operation to the number of times the strobe signal toggles during the second measurement operation to calibrate delay amounts of the first and second delay path circuits to be the same.

2. The semiconductor device of claim 1, further comprising a calibration control circuit configured to control the second measurement operation to be performed after the first measurement operation is performed in a calibration mode,
wherein a period in which the first measurement operation is performed is set to be the same as a period in which the second measurement operation is performed.

3. The semiconductor device of claim 1, wherein the calibration circuit is configured to receive the strobe signal and output the strobe signal as the oscillation strobe signal when the first measurement operation or the second measurement operation is performed, and
wherein the oscillation strobe signal is toggled while the first measurement operation or the second measurement operation is performed.

4. The semiconductor device of claim 3, wherein each of the first and second delay path circuits comprises an inverter chain in which a plurality of inverters are connected in series.

5. The semiconductor device of claim 1, wherein the calibration circuit is configured to calibrate the delay amount of at least one of the first and second delay path circuits when the number of toggles of the strobe signal in the first measurement operation is different from the number of toggles of the strobe signal in the second measurement operation.

6. The semiconductor device of claim 5, wherein the calibration circuit is configured to perform at least one of an operation that increases the delay amount of the first delay path circuit and an operation that decreases the delay amount of the second delay path circuit when the number of toggles of the strobe signal in the first measurement operation is greater than the number of toggles of the strobe signal in the second measurement operation.

7. The semiconductor device of claim 6, wherein the calibration circuit is configured to perform at least one of an operation that decreases the delay amount of the first delay path circuit and an operation that increases the delay amount of the second delay path circuit when the number of toggles of the strobe signal in the first measurement operation is less than the number of toggles of the strobe signal in the second measurement operation.

8. The semiconductor device of claim 5, wherein the calibration circuit is configured to calibrate the delay amounts of the first and second delay path circuits in proportion to a difference between the number of toggles of the strobe signal in the first measurement operation and the number of toggles of the strobe signal in the second measurement operation.

9. The semiconductor device of claim 1, wherein the calibration circuit is configured to maintain the delay amounts of the first and second delay path circuits when the number of toggles of the strobe signal in the first measurement operation is the same as the number of toggles of the strobe signal in the second measurement operation.

10. The semiconductor device of claim 1, wherein the calibration circuit comprises:
an oscillation strobe signal generation circuit configured to receive the strobe signal to generate the oscillation strobe signal when the first measurement operation or the second measurement operation is performed;
a counter configured to count the number of toggles of the oscillation strobe signal, while the first measurement operation is being performed, to generate a first count signal and configured to count the number of toggles of the oscillation strobe signal, while the second measurement operation is being performed, to generate a second count signal; and
a delay control circuit configured to compare a value of the first count signal with a value of the second count signal to calibrate the delay amounts of the first and second delay path circuits to be the same.

11. The semiconductor device of claim 10, wherein the oscillation strobe signal generation circuit comprises:
a control circuit configured to activate an enable signal while the first measurement operation or the second measurement operation is being performed; and
an inverting circuit configured to receive the strobe signal to output the strobe signal as the oscillation strobe signal while the enable signal is activated.

12. The semiconductor device of claim 1, wherein the strobe transmission circuit is configured to:
output one of a first pre-strobe signal and the oscillation strobe signal as the strobe signal through the first delay path circuit based on whether the first measurement operation is performed, and
output one of a second pre-strobe signal and the oscillation strobe signal as the strobe signal through the second delay path circuit based on whether the second measurement operation is performed.

13. The semiconductor device of claim 12, further comprising a pre-strobe signal generation circuit configured to generate one of the first and second pre-strobe signals based on addresses when a read operation is performed,
wherein the first pre-strobe signal is transmitted to a first data storage region through the first delay path circuit to output internal data that is stored in the first data storage region, and wherein the second pre-strobe signal is transmitted to a second data storage region through the second delay path circuit to output internal data that is stored in the second data storage region.

14. The semiconductor device of claim 13, further comprising a data output circuit configured to latch the internal data in synchronization with the strobe signal and configured to output the latched internal data as data.

15. A semiconductor device comprising:
- a strobe transmission circuit configured to output one of a pre-strobe signal and an oscillation strobe signal as a strobe signal through a delay path circuit based on whether a measurement operation is performed;
- an oscillation strobe signal generation circuit configured to receive the strobe signal to output the strobe signal as the oscillation strobe signal while the measurement operation is being performed; and
- a counter configured to count the number of toggles of the oscillation strobe signal to generate a count signal while the measurement operation is being performed.

16. The semiconductor device of claim 15,
wherein the strobe transmission circuit is configured to output a pre-strobe signal as the strobe signal through the delay path circuit when the measurement operation is not performed, and
wherein the pre-strobe signal is transmitted to a data storage region through the delay path circuit to output internal data that is stored in the data storage region.

17. The semiconductor device of claim 16, further comprising a data output circuit configured to latch the internal data in synchronization with the strobe signal and output latched internal data as data.

18. The semiconductor device of claim 15,
wherein the strobe transmission circuit is configured to output the oscillation strobe signal as the strobe signal through the delay path circuit while the measurement operation is being performed, and
wherein the oscillation strobe signal is toggled while the measurement operation is being performed.

19. The semiconductor device of claim 18, wherein the delay path circuit comprises an inverter chain in which a plurality of inverters are connected in series.

20. The semiconductor device of claim 18, wherein the oscillation strobe signal generation circuit comprises:
- a control circuit configured to activate an enable signal while the measurement operation is being performed; and
- an inverting circuit configured to receive the strobe signal to output the strobe signal as the oscillation strobe signal while the enable signal is activated.

* * * * *